United States Patent [19]
Banitt et al.

[11] Patent Number: 5,283,716
[45] Date of Patent: Feb. 1, 1994

[54] ELECTRICAL COMPONENT SUPPORT STRUCTURE

[75] Inventors: Troy R. Banitt, Savage; Patrick M. Dobrowski, Burnsville; Michael P. Grant, Maple Grove; Michael A. La Haye, Edina; Carey M. Manson, Mound; Kelly M. Orth, Apple Valley, all of Minn.

[73] Assignee: Rosemount Inc., Eden Prairie, Minn.

[21] Appl. No.: 963,317

[22] Filed: Oct. 16, 1992

[51] Int. Cl.$^5$ .............................................. H05K 7/02
[52] U.S. Cl. ................................. 361/810; 361/690; 361/825
[58] Field of Search .................................. 174/138 D; 361/383–384, 386–389, 393, 396, 400, 417, 419, 420, 427, 429

[56] References Cited

U.S. PATENT DOCUMENTS

| | | | |
|---|---|---|---|
| 3,780,798 | 12/1973 | Reimer | 361/383 |
| 4,124,267 | 11/1978 | Mines et al. | 339/125 |
| 4,363,075 | 12/1982 | De Remer | 361/383 |
| 4,618,915 | 10/1986 | Bury | 361/420 |
| 4,727,456 | 2/1988 | Mehta et al. | 361/417 |
| 4,755,146 | 7/1988 | Rishworth et al. | 361/383 |
| 4,874,336 | 10/1989 | Marsh | 439/607 |
| 4,951,176 | 8/1990 | Bergfried et al. | 361/417 |
| 4,984,064 | 1/1991 | Toshio et al. | 361/400 |

FOREIGN PATENT DOCUMENTS 2626578 12/1977 Fed. Rep. of Germany .

OTHER PUBLICATIONS

Rosemount System 3™, Product Data Sheet PDS 4645, published Oct. 1992.
Product Data Sheet, Solder-in Socket, SIM-AMS for I/O-Modules (no known date).

*Primary Examiner*—Gregory D. Thompson
*Attorney, Agent, or Firm*—Westman, Champlin & Kelly

[57] ABSTRACT

A component support assembly releasably retains, electrically insulates and improves thermal transfer of a plurality of vertically stacked electrical components associated with the operation of a printed circuit card. Each of a plurality of integrally-molded component support structures made of a electrically insulating material has a base member, a receiving member for releasably retaining electrical components thereto and pins for anchoring the base member to a printed circuit card. The base member has apertures so that the electrical leads of the electrical components can pass through the base member and connect to the conductors of the printed circuit card. The base member is shaped so that major planar surfaces of the electrical components are retained at an acute angle relative to vertical, thereby improving thermal transfer from the electrical components to the ambient air when a plurality of like component support structures are mounted on the printed circuit card.

14 Claims, 3 Drawing Sheets

ELECTRICAL COMPONENT SUPPORT STRUCTURE

BACKGROUND OF THE INVENTION

The present invention relates to the field of computerized control systems hardware and in particular to a component support structure and a method for retaining, for electrically insulating and for dissipating heat from electrical components of a printed circuit card operating in computerized control systems.

Various methods of preventing components from becoming dislodged from a printed circuit card are known in the art. A known method of retaining the components to the printed circuit card utilizes a bracket and suitable screw. This method also incorporates a metal bar with standoff portions machined into the printed circuit card to effect electrical insulation of the component. Circuit cards often carry exposed live conductors suitable for connecting to the components. A known method of insulating the live conductors of the printed circuit card from manual contact is to cover the printed circuit card with a film of nonconducting material such as resin, polymer or rubber. The potential of electrical shock during careless repair and replacement as well as the threat of electrical arcing decreases. Some of these prior art devices thus provide electrical insulation and retainment for an electrical element. However, these prior art devices and methods do not adequately address thermal transfer from the components. Though it is known in the art that effective thermal transfer improves reliability and permits greater component density associated with the circuit card.

Electrical components that carry, relay or convert large amounts of electrical current generate heat and are an obstacle to the design of densely-packed printed circuit cards. Thus, the elimination of heat islands that adversely impact reliability has long been a goal in the design of efficient control systems. Cooling fans or other dedicated mechanisms have been traditionally used in the art to dissipate heat generated from the various elements used in computing architecture. These mechanisms add weight, cost and complexity to cool the components.

These prior art approaches to attachment and electrical insulation of components do not adequately address thermal transfer necessary to dissipate heat from the components associated with the printed circuit card. Thus, a need exists for a component support structure that improves thermal transfer from densely-packed electrical components associated with printed circuit cards of modern computer architecture.

SUMMARY OF THE INVENTION

According to the present invention an integrally-molded discrete component support structure (1) retains a mini solid state electrical element to a printed circuit card, (2) insulates the live conductors of the printed circuit card from manual contact and (3) when a plurality of the component support structures on a printed circuit card supports a plurality of component support structures heat dissipation from the electrical components of the printed circuit card improves when compared to existing component supports.

The component support structure of the present invention supports electrical components having major planar heat dissipating surfaces to create thermal passages between densely-packed electrical components, thereby improving thermal transfer from the electrical components to the ambient air. The thermal passageways extend at an acute angle relative to vertical so that turbulent conventional air flow among the components aids efficient thermal transfer from the electrical components to the ambient air. The heated air travels only a short distance along the thermal passageway to escape from the components of an energized densely-packed printed circuit card.

The component support structure insulates the electrical components from the live conductors of the printed circuit card. Retaining means releasably connect the electrical component to the component support structure. The component support structure of the present invention provides a pattern of thermal passageways interconnecting the electrical components on an adjacent component support structure in a heat transferring relationship. The component support structure of the present invention is simple to construct and, when combined with like component support structures, arranges the electrical components to efficiently transfer heat from components of the entire printed circuit card circuit.

DESCRIPTION OF THE PREFERRED EMBODIMENTS

Figure 1:
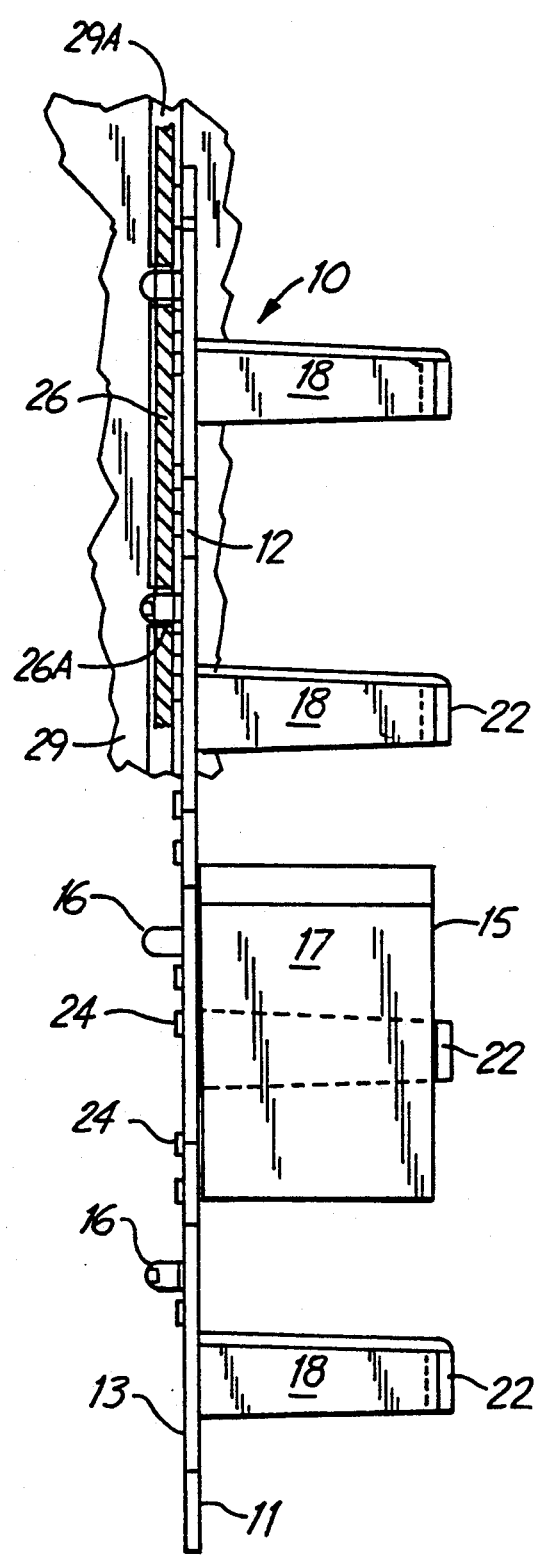
FIG. 1 is a side view of the discrete component support structure of the assembly of the present invention.
Figure 2:
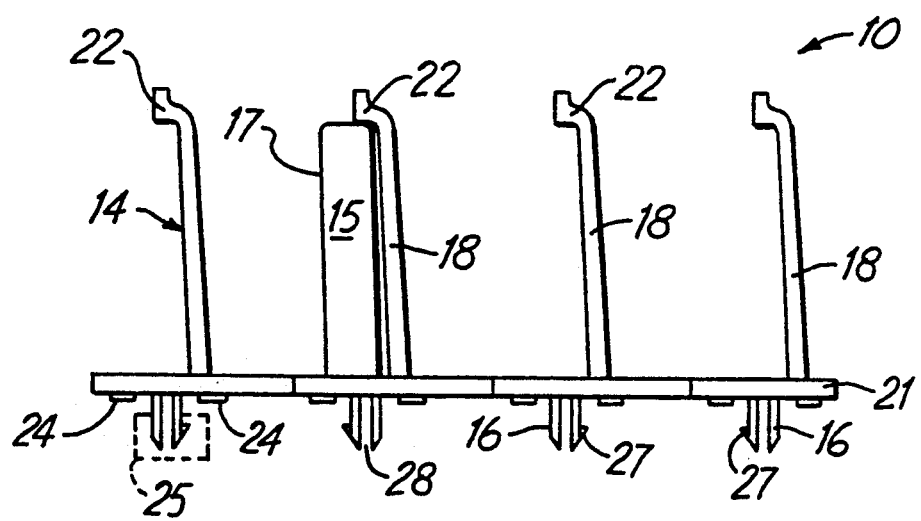
FIG. 2 is an end elevational view of the discrete component support structure of the assembly of the present invention, taken generally on line 2—2 in FIG. 3.

In FIG. 1 and FIG. 2, a single discrete component support structure or bracket of the assembly of the present invention is shown generally at 10. Each component support structure includes a base member 12, preferably made of electrically insulating resin material; a plurality of electrical component receiving means, shown generally at 14, for retaining electrical components 15 attached to a first face 11; and securing means 16 for attaching the second face 13 of component support structure 10 to a printed circuit card 26.

Figure 4:
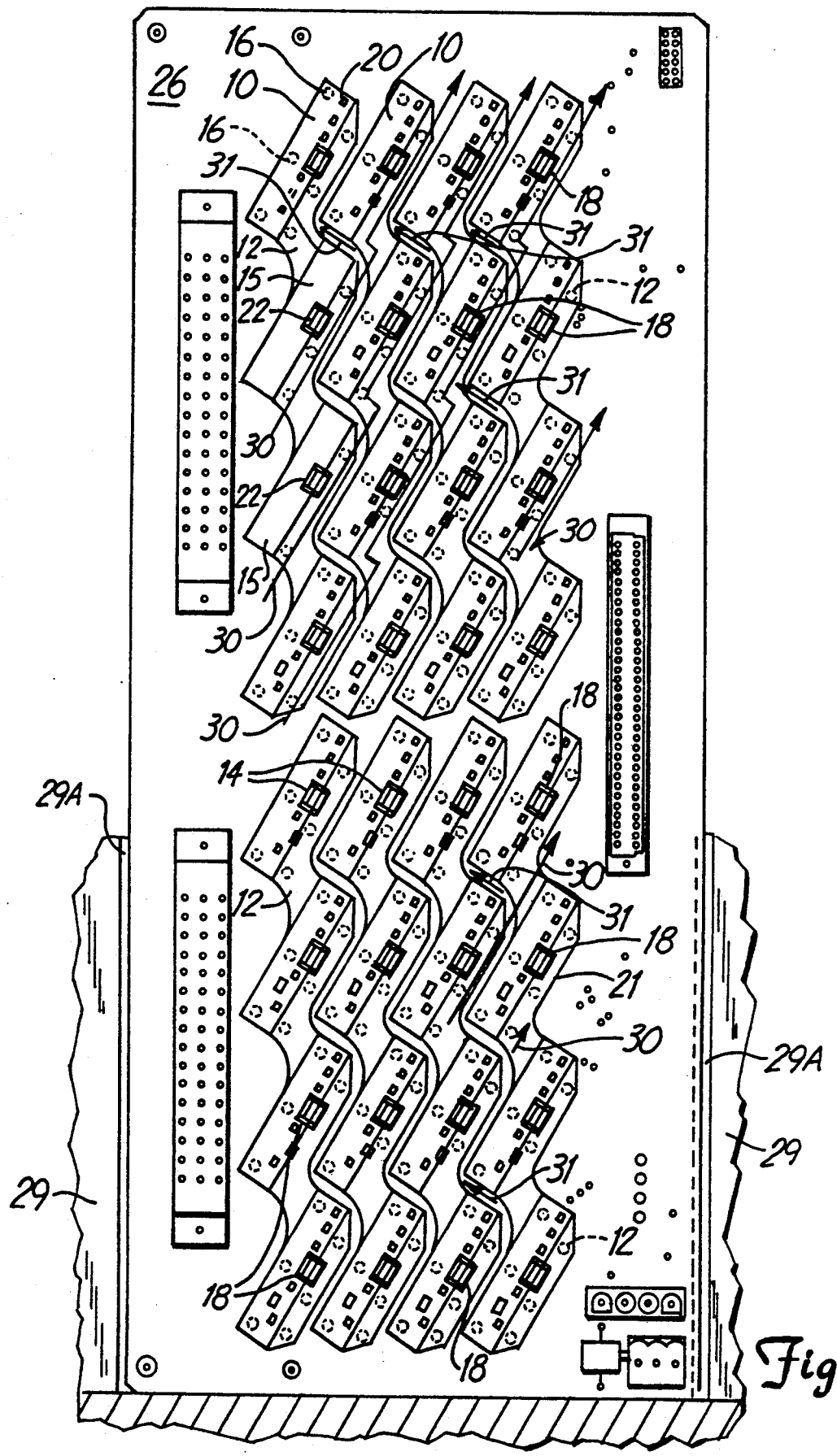
FIG. 4 is a plan view of a printed circuit card with a plurality of the preferred embodiment of the component support structures of the present invention mounted thereon for efficient thermal transfer.

Electrical component receiving means 14 has a manually deflectable member 18 that forms part of electrical component receiving means 14 and biases an electrical component 15 toward the first face 11 of base member 12 so that the electrical leads associated with the electrical component 15 pass through a plurality of apertures 20 in base member 12 forming part of receiving means 14 to establish electrical contact with the printed circuit card shown in FIG. 4 at 26. The manually deflectable member 18 connects to the first face 11 of the base member 12 at a first end and a bent portion 22 formed at a second end releasably and frictionally engages an electrical component 15.

Component receiving means 14 covers a minimal portion of the major planar heat dissipating surface 17 of electrical component 15 to provide open areas for heat dissipation.

The securing means 16 for attaching the component support structure 10 to a printed circuit card comprise a plurality of pin members 16 each with a distal end attached to the second face of base member 12 and a proximal end adapted to be anchored to the printed circuit card 26. In the preferred embodiment, a portion 27 of the proximal end 25 of each pin member 16 enlarges and a longitudinal slot 28 formed therein permits the proximal end 25 of pin member 16 to contract the pin member 16 as it is inserted into a port, or opening 26A, of a printed circuit card 26 and will expand following insertion, thereby anchoring the entire component support structure 10 to the printed circuit card 26. Other suitable securing means 16 include, without limitation, screws, clamps, electrically insulating adhesives and brackets, either as separate pieces or integrally formed into the component support structure 10 or the printed circuit card 26.

In the preferred embodiment, a plurality of insulating bosses 24, preferably integrally formed to protrude from the second side of base member 12 proximate the pin members 16 maintain base member 12 equidistant from the printed circuit card 26 thereby ensuring electrical isolation between the first side of base member 12 and the live conductors, not shown, associated with an energized printed circuit card 26. The integral bosses 24 on the second side of base member 12 are large enough to effect electrical isolation as described.

Figure 3:
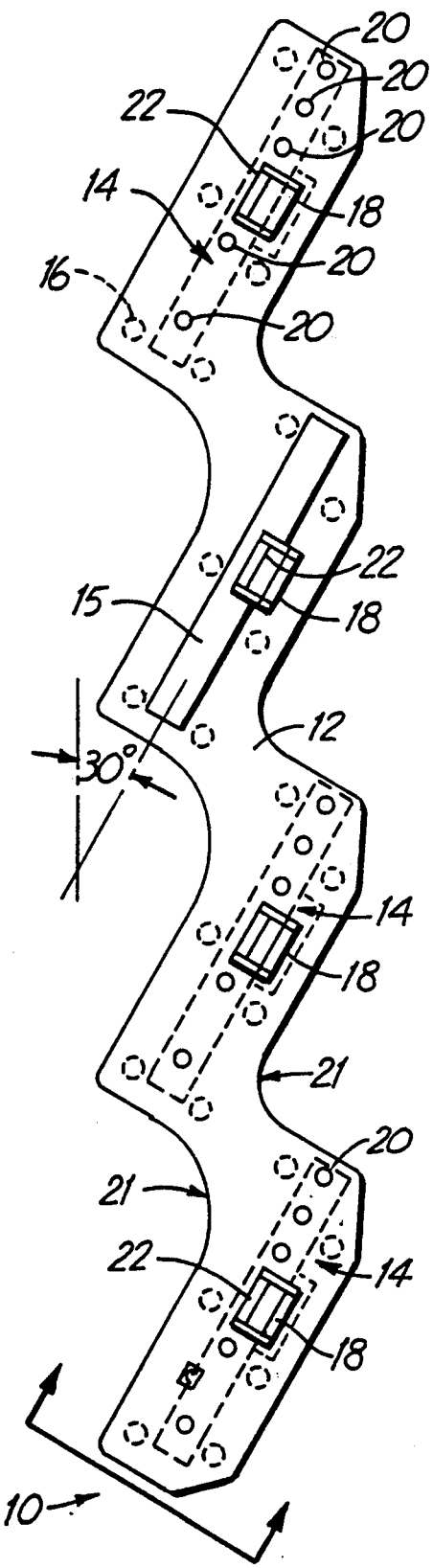
FIG. 3 is a plan view of the discrete component support structure of the assembly of the present invention.

In FIG. 3, a plan view of the component support structure 10 described above shows the step-shape edges of the base member 12.

The step-shaped edges 21 of the base member 12 as shown in FIG. 4 allow a plurality of component support structures 10 to be nested so that component support structures 10 and electrical components 15 may be densely packed on a printed circuit card 26. The printed circuit card 26 stacks with its plane vertical in a vertical slot 29A of a schematically shown printed circuit card cage 29. Component support structures 10 retain electrical components 15 in position so that the major planar heat dissipating surfaces 17 define a plurality of thermal passageways at an acute angle to the vertical, shown by arrows 30, thereby aiding heat dissipation to the ambient air. In the preferred embodiment, the electrical component 15 major planar heat dissipating surfaces 17 extend at an acute angle of thirty degrees from the vertical as shown in FIG. 3. As can be seen in FIG. 4, any heat emanating from a component 15 rises through the circuit card and component assembly and is preferably diverted along primary thermal passageways 30, shown by solid axial lines, to a lateral side of printed circuit card 26 where it will disperse. A portion of the heated air diverts through secondary thermal passageways 31, shown by solid axial lines transverse to primary thermal passageways 30, thereby inducing air turbulence in the air traveling along primary thermal passageway 30 and further improving thermal transfer from the electrical components 15 to the ambient air. In the preferred embodiment, each thermal passageway 30 extends across a number of electrical components no greater than the number of vertical columns of electrical components associated with the printed circuit card 26. Thus, the heat generated by an electrical component 15 passes beyond the assembly and does not concentrate at the upper-most electrical components, as occurs with either horizontally or vertically positioned electrical components of the prior art. Improved heat dissipation and reliability improves and an increased number and density of electrical components are operable on the same size printed circuit card without the aid of additional dedicated cooling mechanisms.

Although the present invention has been described with referenced to preferred embodiments, workers skilled in the art will recognize that changes may be made in form and detail without departing from the spirit and scope of the invention.

What is claimed is:

1. An assembly that retains, electrically insulates and enhances the thermal transfer of a plurality of electrical components, each electrical component having at least one major planar heat dissipating surface associated with the operation of a printed circuit card comprising:
   a plurality of base members each having first and second substantially planar faces and made of an electrically insulating material;
   receiving means for releasably retaining the electrical components to the first face of each of the base members and oriented to be one above the other in use; and
   securing means for anchoring the second face of each of the base members to a printed circuit card so that the major heat dissipating surfaces of electrical components retained by the receiving means are generally parallel and extend outwardly from the first face of the respective base member and the receiving means being positioned to hold the major heat dissipating surfaces of the electrical components inclined at an acute angle relative to vertical.

2. The assembly of claim 1 wherein each base member has a plurality of apertures for passing a plurality of electrical leads associated with the electrical components therethrough.

3. The assembly of claim 2 wherein the acute angle relative to vertical is substantially thirty degrees.

4. The assembly of claim 3 wherein each base member is step-shaped at side edges so that when a plurality of base members are secured to the printed circuit card primary thermal passageways among the electrical components are formed across the printed circuit card from edge to edge and secondary thermal passageways are formed among the electrical components substantially normal to the primary thermal passageways.

5. The assembly of claim 4 wherein the receiving means comprises a separate manually deflectable member having a first end made of electrically insulating material and connected to each of the base members and a bent portion formed at a second end of each deflectable member for relasably retaining the respective electrical components.

6. The assembly of claim 5 wherein the second face of each of the base members has a plurality of bosses formed thereon.

7. The assembly of claim 5 wherein four electrical components are releasably retained on each base member, each by a manually deflectable member and form a vertical stack when retained on a printed circuit card.

8. The assembly of claim 1 wherein the securing means for each base member comprises a plurality of pins, each having a proximal end attached to the second face of the respective base member and a distal end, wherein a portion of the distal end of each pin is enlarged.

9. The assembly of claim 8 wherein a slot is formed into the enlarged portion of the distal end of each pin.

10. The assembly of claim 9 wherein each of the base members, the receiving means and the pins are integrally molded from an electrically insulating material.

11. The assembly of claim 10 wherein the electrically insulating material is a resin capable of extrusion in an injection molding process.

12. A method of aiding passive thermal transfer of components associated with a printed circuit card circuit comprising the steps of:

positioning a substantially planar printed circuit card vertically, the printed circuit card having conductors for electrically coupling a plurality of electrical components thereto;

anchoring a plurality of electrically insulating component support structures between the printed circuit card and the plurality of electrically components, each electrical component having opposing major planar heat dissipating surfaces;

releasably engaging the plurality of electrical components to the electrically insulating component support structures in position one above the other; and electrically connecting the electrical components to the conductors of the printed circuit cad so that the opposing major heat dissipating surfaces of each electrical component are situated at an acute angle relative to vertical and substantially parallel to the opposing major heat dissipating surfaces of others of the plurality of electrical components releasably engaged to the electrically insulating component support structure.

13. The method of claim 12 wherein the acute angle is 30 degrees from vertical.

14. An assembly fitting into a vertical slot in a circuit card cage, the assembly comprising:

a plurality of manually removable heat dissipating electrical components having major planar heat dissipating surfaces;

a printed circuit card engaging the slot and carrying conductors and an array of the electrical components separated from one another by air spaces and arranged in diagonal columns on the circuit card, the major planar heat dissipating surfaces tilting from the vertical to increase cooling turbulence in the air space; and at least one bracket formed of electrically insulating resin releasably attached to the printed circuit card and covering the conductors carried thereon, so that the conductors are isolated from manual contact, and releasably retaining each of the plurality of the heat dissipating components with a separate manually deflectable member formed on the bracket.

* * * * *